A

United States Patent [19]
McNamara et al.

[11] Patent Number: 6,046,486
[45] Date of Patent: Apr. 4, 2000

[54] HETEROJUNCTION BIPOPLAR MIXER CIRCUITRY

[75] Inventors: Brian J. McNamara, Worcester; John P. Wendler, Stowe; Kamal Tabatabaje-Alavi, Sharon, all of Mass.

[73] Assignee: Raytheon Company, Lexington, Mass.

[21] Appl. No.: 09/138,582

[22] Filed: Aug. 21, 1998

Related U.S. Application Data

[62] Division of application No. 08/774,237, Dec. 27, 1996, Pat. No. 5,837,589.

[51] Int. Cl.[7] .................................................. H01L 27/02
[52] U.S. Cl. .......................... 257/477; 257/197; 455/86; 455/323
[58] Field of Search .................................... 257/477, 197; 455/84, 85, 86, 118, 119, 120, 125, 126, 127, 313, 323

[56] References Cited

U.S. PATENT DOCUMENTS

| | | |
|---|---|---|
| 3,922,570 | 11/1975 | Eguchi et al. ............................ 307/270 |
| 4,411,022 | 10/1983 | Clifton et al. ........................... 455/327 |
| 4,677,691 | 6/1987 | Scott ....................................... 455/318 |
| 5,051,372 | 9/1991 | Sasaki ......................................... 437/5 |
| 5,268,315 | 12/1993 | Prasad et al. ............................. 437/31 |
| 5,341,112 | 8/1994 | Haman ................................. 331/116 R |
| 5,401,999 | 3/1995 | Bayraktaroglu ......................... 257/189 |
| 5,753,960 | 5/1998 | Dickmann .............................. 257/458 |
| 5,821,825 | 10/1998 | Kobayashi ................................ 331/66 |

Primary Examiner—Jerome Jackson, Jr.
Assistant Examiner—Bradley William Baumeister
Attorney, Agent, or Firm—Fish & Richardson P.C.

[57] ABSTRACT

Mixer circuitry having a semiconductor body formed therein mixer circuitry having an oscillator having a heterojunction bipolar transistor and a mixer having a Schottky diode. The heterojunction transistor has a collector region formed in one portion of doped layer of the semiconductor body and the diode has a metal electrode is Schottky contact with another portion of such doped layer. The mixer is includes a diode and a DC biasing circuit, comprising a constant current, for biasing such diode to predetermined operating point substantially invariant with power of an input signal fed to such mixer.

14 Claims, 9 Drawing Sheets

HETEROJUNCTION BIPOPLAR MIXER CIRCUITRY

This is a divisional of U.S. patent application Ser. No. 08/774,237, filed Dec. 27, 1996, now U.S. Pat. No. 5,837,589.

BACKGROUND OF THE INVENTION

This invention relates generally to mixer circuitry and more particularly to mixer circuitry having a local oscillator and mixer formed as a monolithic microwave integrated circuit (MMIC).

As is known in the art, mixer circuitry is used in a wide variety of applications. In one such application, the mixer includes a local oscillator for providing a radio frequency signal which, after amplification, is transmitted, via a suitable transmitter antenna, as a continuous wave (CW) radar signal. Energy reflected by an object in the path of the transmitted CW radar signal is fed, via a suitable antenna, to a mixer circuit. Also fed to the mixer is a portion of the continuous wave signal produced by the local oscillator. The mixer thereby produces an intermediate frequency signal having as a frequency component thereof a frequency related to the Doppler velocity of the object producing the reflected energy.

As is also known in the art, in order to reduce the size of such mixer circuitry it is desirable to increase the operating frequency of the local oscillator. One application requires that the oscillator produce a frequency in the millimeter wavelength region. One type of transistor adapted in the millimeter wavelength region is a heterojunction bipolar transistor (HBT). Such transistor may include a semi-insulating gallium arsenide (i.e., III-V material) substrate, an N+ type conductivity GaAs subcollector layer, an N type conductivity GaAs collector layer, a P+ type conductivity type base layer, an N type conductivity InGaP, or AlGaAs emitter layer and an N+ type conductivity type emitter contact layer sequentially formed as a single crystal body. As is also known in the art, it is desirable to form microwave circuitry as a monolithic microwave integrated circuit (MMIC) where both active devices, such as transistors, and passive devices, such as microstrip transmission lines, are also formed on the single crystal body. While such MMIC is desirable, such may not be practical to manufacture because one type of active device may not be readily compatible, from a manufacturing aspect, with other types of devices. That is, the two types of devices may not be readily formed with sufficient common processing steps to produce an MMIC which is economically practical. For example, while it is desirable to use Schottky diodes in the mixer circuitry discussed above, fabrication of the HBT oscillator of the mixer with sufficient processing steps common with the production of the Schottky diodes to result in an economical process has not been described.

As is also known in the art, in order to minimize the conversion efficiency of the mixer circuit, the diode used therein should be DC biased to some optimum operating point on its voltage-current (i.e., V-I) characteristic curve. However, the DC bias point varies with the power of the local oscillator signal. Therefore, because the power of the local oscillator varies with the operating temperature of the oscillator, the mixer will not operate with minimum conversion loss over the operating temperature of the mixer circuitry.

SUMMARY OF THE INVENTION

In accordance with the present invention, mixer circuitry is provided having formed in a semiconductor body, an oscillator having a heterojunction bipolar transistor and, a mixer having a Schottky diode. The heterojunction bipolar transistor has a collector region formed in one portion of a doped layer of the semiconductor body and the Schottky diode has a metal electrode in Schottky contact with another portion of such doped layer.

With such an arrangement, mixer circuitry may be practically manufactured as a monolithic microwave integrated circuit.

In accordance with another feature of the invention, a mixer is provided comprising a diode and a DC biasing circuit. The DC biasing circuit comprises a constant current, for biasing such diode to predetermined operating point substantially invariant with power of an input sign fed to such mixer.

BRIEF DESCRIPTION OF THE DRAWING

Other features of the invention, as well as the invention itself, will become more readily apparent from the following detailed description read together with the following drawings, in which.

DESCRIPTION OF THE PREFERRED EMBODIMENTS

Figure 1:
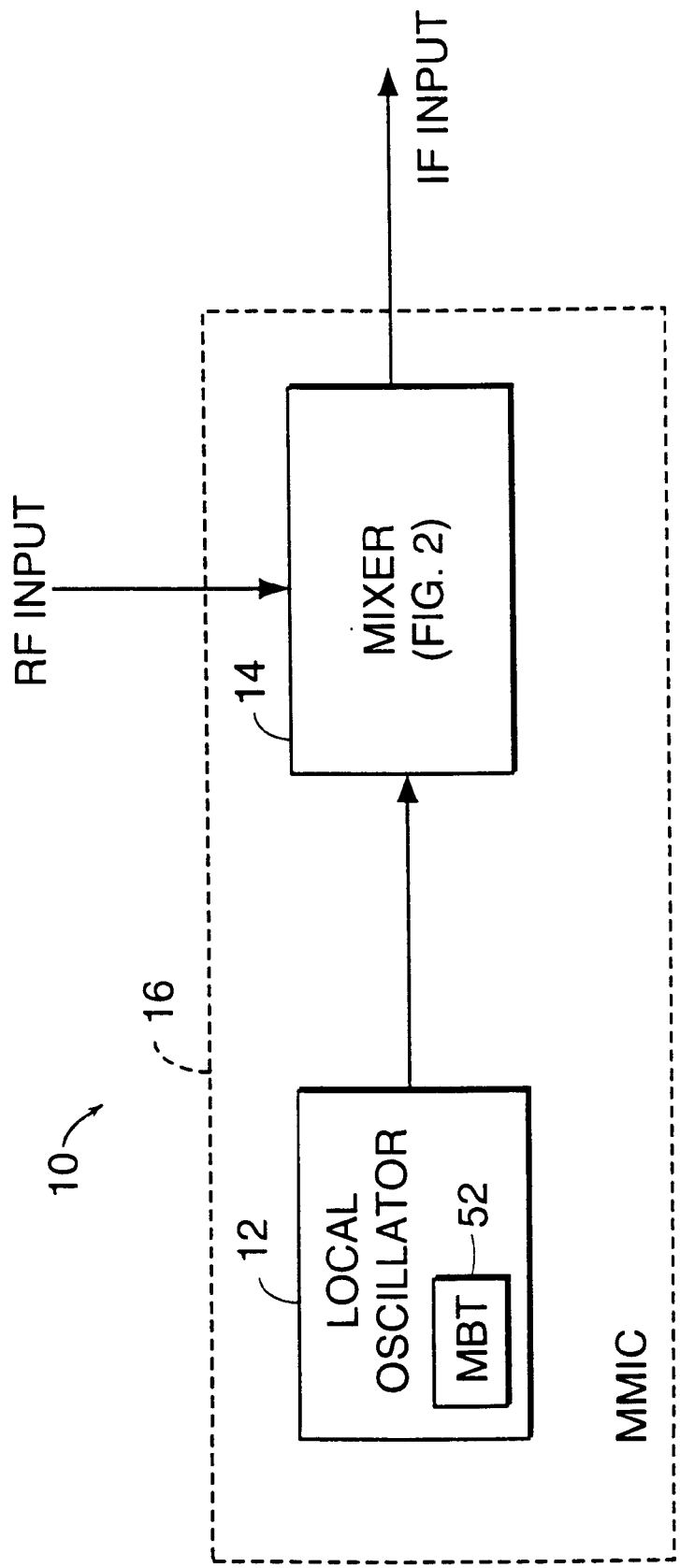
FIG. 1 is a schematic block diagram of mixer circuitry according to the invention.
Figure 2:
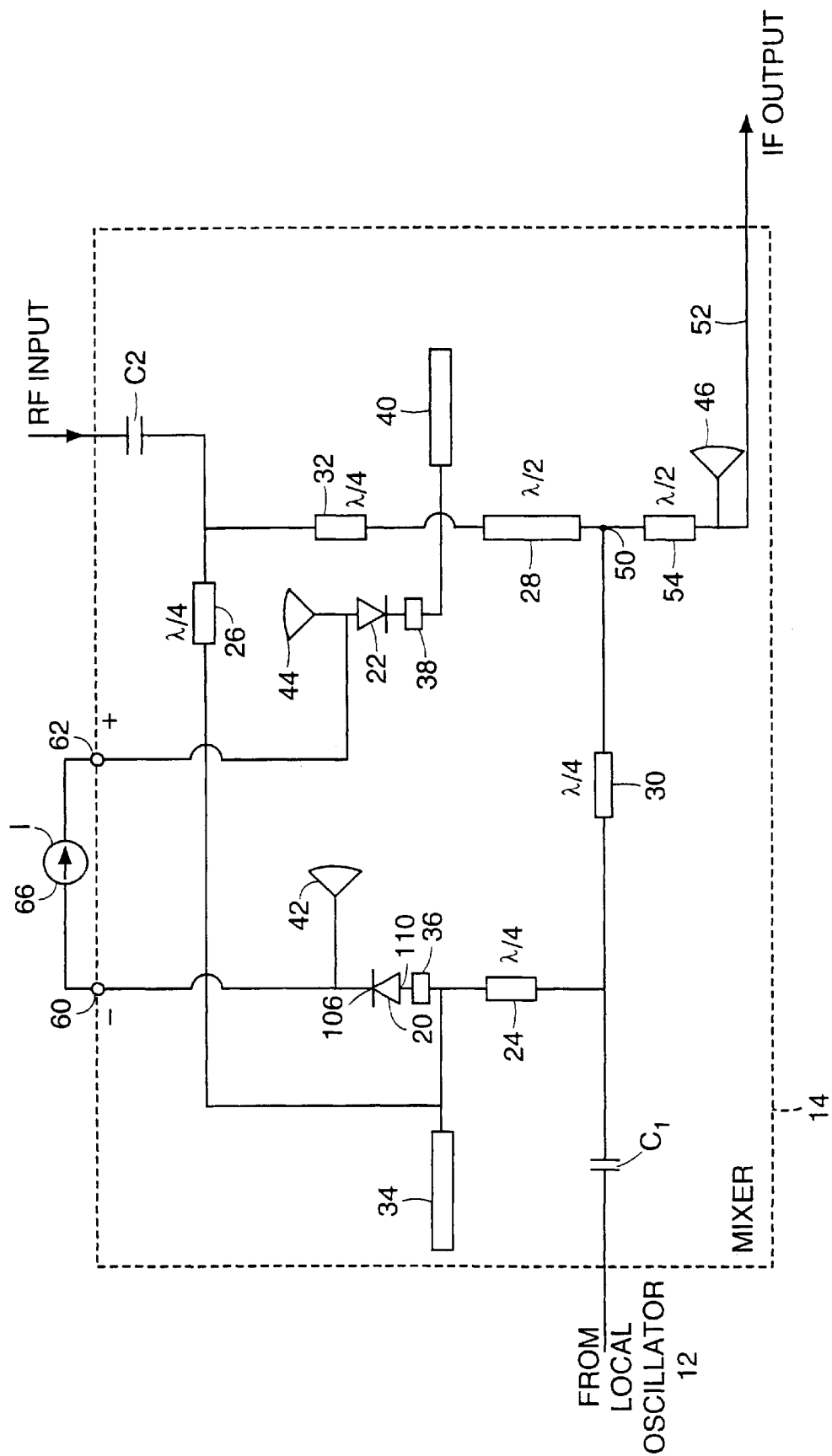
FIG. 2 is a schematic diagram of a mixer used in the mixer circuitry of FIG. 1.

Referring now to FIG. 1, mixer circuitry 10 is shown having a local oscillator 12 providing a local oscillator signal for a mixer 14. The mixer 14, shown in detail in FIG. 2, is also fed by a radio frequency (RF) signal to produce an intermediate frequency (IF) output signal having as a frequency component thereof the difference between the frequency of the local oscillator signal, here 76.5 GHz, and the frequency of the RF signal, here having a nominal frequency of 75.5 GHz. The oscillator 12 and mixer 14 are formed in a single crystal semiconductor body, here GaAs body 16, as a monolithic microwave integrated circuit (MMIC).

Referring to FIG. 2, the mixer 14 is here a DC biased rat race mixer having a pair of Schottky diodes 20, 22. The anode of diode 20 is coupled to the local oscillator signal through a quarter wavelength transmission line 24 and to the RF input signal through a quarter wavelength transmission line 26, as shown. The cathode of diode 22 is coupled to the local oscillator signal through a pair of serially connected half and quarter wavelength transmission lines 28, 30, respectively, and to the RF input signal through a quarter wavelength transmission line 32, as shown. A pair of DC blocking capacitors C1, C2 is provided, as shown. Diode matching tuning stubs 34, 36, 38 and 40 and RF radial ground stubs 42, 44, 46, all arranged as shown, are also provided. The IF signal is produced by mixer 14 by coupling the junction 47 between the half wavelength transmission line 28 and the quarter wavelength transmission line 30 to output line 48 via half wavelength transmission line 49, as shown. A layout of the mixer 14 is shown in FIG. 3 with like elements being indicated by like numerical designation.

Figure 3:
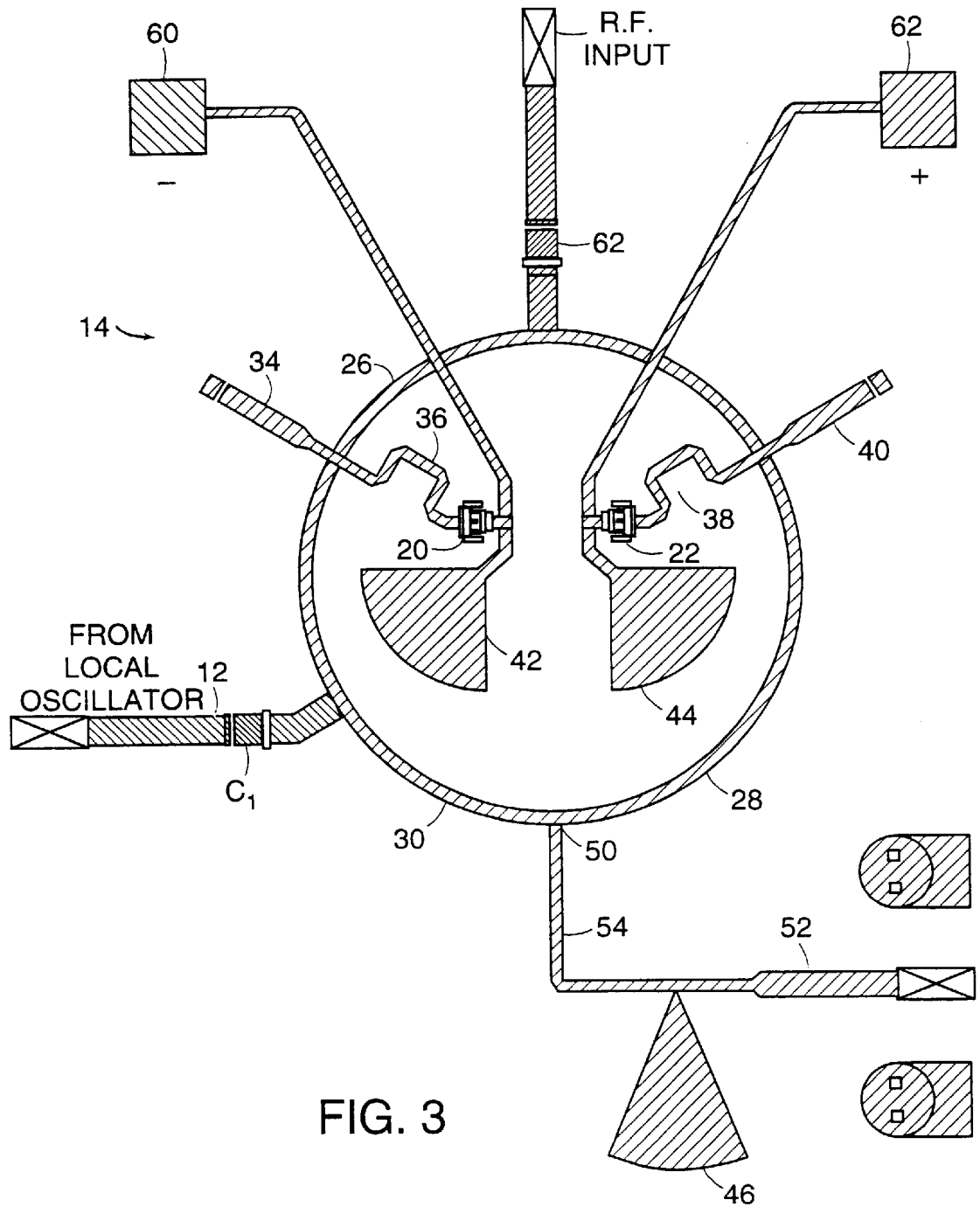
FIG. 3 is a plan view of the mixer of FIG. 2.

Referring both to FIGS. 2 and 3, it is noted that the cathode of diode 20 is connected to a−terminal 60 and the cathode of diode 22 is connected to a+terminal 62. A constant current source 66, shown in FIG. 2, is connected to the terminals 60, 62 to provide a DC bias to the diodes 20, 22. The current, I, fed to the diodes 20, 22 by the constant current source is selected to maximize the conversion efficiency of the mixer 14 over the expected operating power level of the local oscillator signal.

Figure 4:
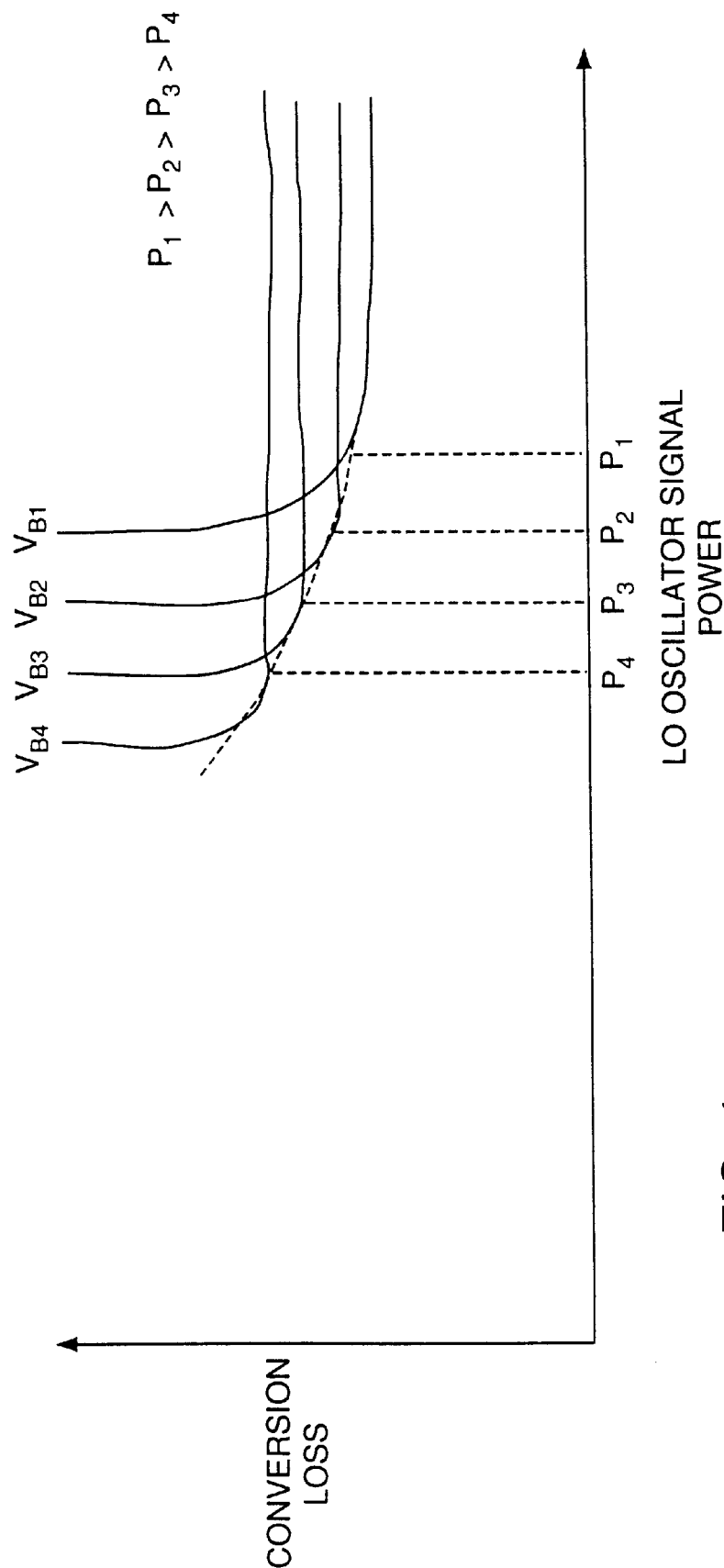
FIG. 4 is a series of curves showing the relationship between mixer conversion loss and local oscillator signal power for various bias voltages applied a mixer circuit.

More particularly, referring to FIG. 4, it is assumed for a moment that instead of coupling constant current source 66 to terminals 60, 62, a voltage source were coupled to such terminals 60, 62. The relationship between mixer conversion loss and local oscillator power is shown for such assumption for different diode bias voltages $V_{B1}$ through $V_{B4}$ provided by the voltage supply. It is noted that for any bias voltage the conversion loss increases with decreasing local oscillator signal power. Further, while a bias voltage of $V_{B1}$ may provide the optimum bias level for power levels greater than $P_1$, bias $V_{B2}$ provides the optimum bias level for power levels less that $P_2$ and greater than $P_1$. Thus, in order to optimize the conversion efficiency of the mixer, the DC bias provided by the assumed voltage source would have to vary as a function of the local oscillator power.

Figure 5:
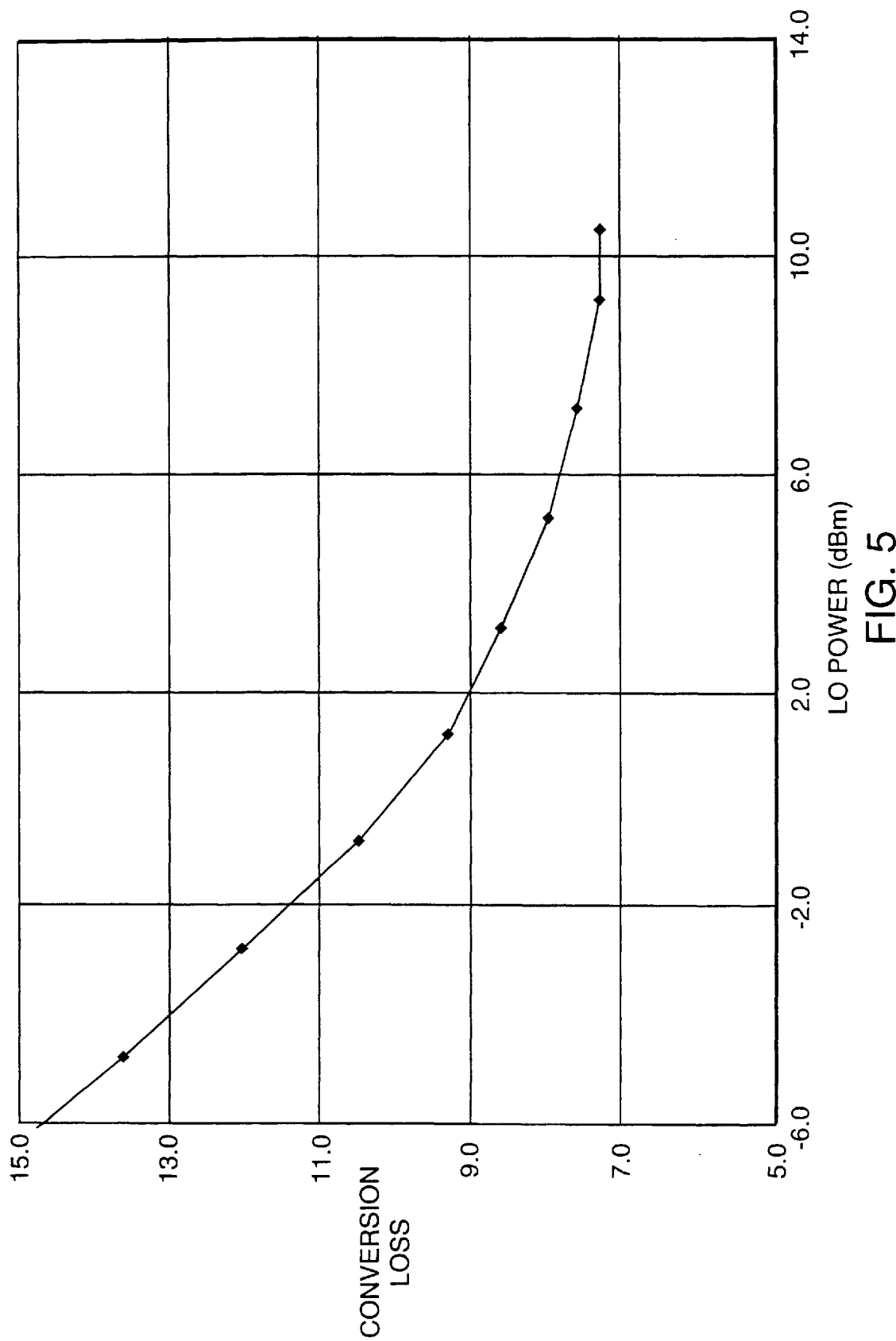
FIG. 5 is a curve showing the relationship between local oscillator power and mixer conversion loss for the mixer of FIG. 2.

We have found, however, that when operating the diode with the bias voltages $V_{B1}$ through $V_{B4}$ over the range of local oscillator power from $P_1$ through $P_4$, i.e. at the optimum bias voltage level to minimize conversion loss, substantially the same level of DC current passed to the diode. Here, the constant current source 66 produces a current of 1 milliamp. For a mixer with a local oscillator frequency of 76.5 GHz, an RF signal frequency of 75.5 GHz, and an RF input power level of −15 dBm, the conversion loss as a function of local oscillator power is shown in FIG. 5. It is noted that the mixer "turns on" (i.e., there is a sharp drop in conversion loss to a suitable value) below 0 dBm of the local oscillator signal power. It is also noted that the conversion loss remains relatively flat for higher levels of oscillator signal power.

Figure 6:
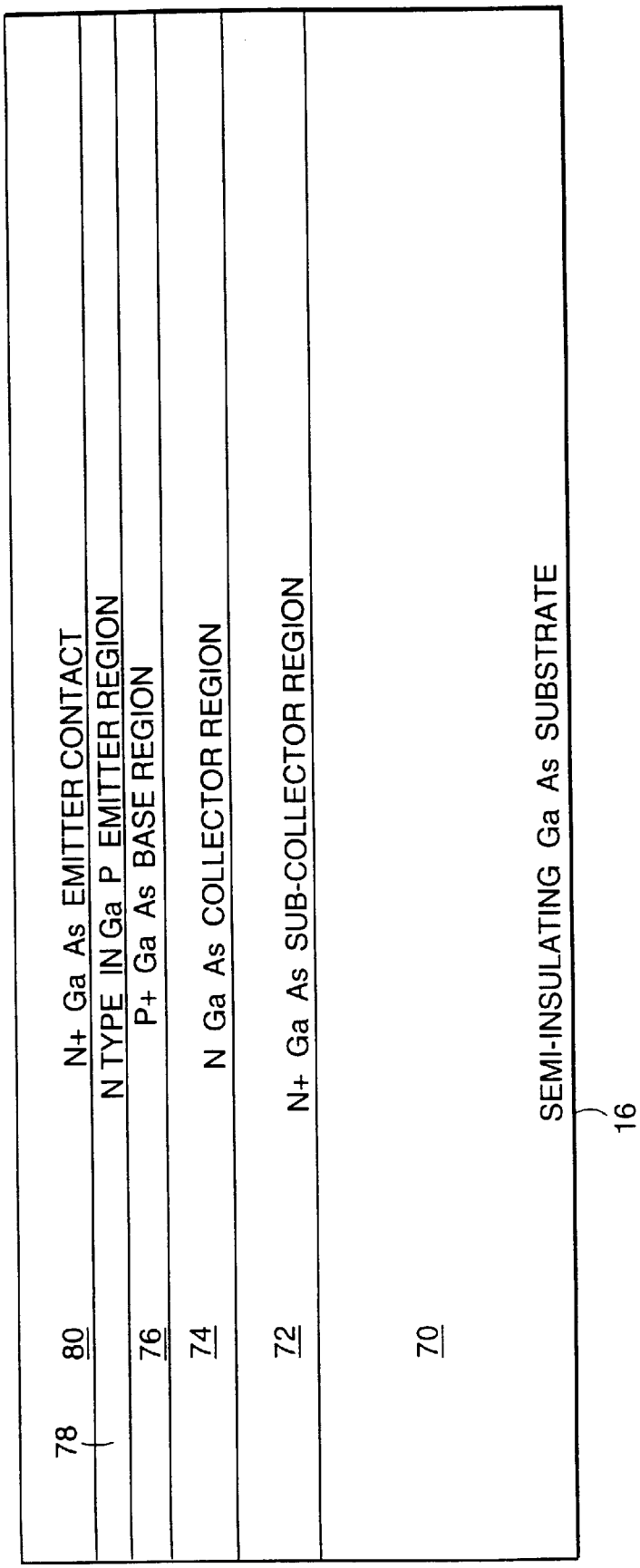
FIG. 6 is a diagrammatical cross sectional view of a semiconductor body adapted to have formed therein both a Schottky diode for the mixer of FIG. 2 and an HBT for a local oscillator used in the mixer circuitry at one stage in the fabrication thereof.

Referring now to FIG. 6, the semiconductor body 16 is shown at one stage in the fabrication of the MMIC. The body 16 includes: a semi-insulating gallium arsenide (i.e., III-V material) substrate 70; an N+ type conductivity GaAs sub-collector layer 72; an N type conductivity GaAs collector layer 74; a P+ type conductivity type base layer 76, an N type conductivity InGaP, or AlGaP, emitter layer 78 and an N+ type conductivity type emitter contact layer 80 sequentially formed in a manner described in detail in copending patent applications Ser. No. 08/744,025 filed Nov. 5, 1996, inventors: Elsa K. Tong et al. (Docket 36756); and Ser. No. 08/740,339 Filed Nov. 11, 1996, inventors: Elsa K. Tong et al. (Docket 36757), assigned to the same assignee as the present invention, the subject matter thereof being incorporated herein by reference. A heterojunction bipolar transistor HBT 82 used in the local oscillator 12 (FIG. 1) is formed by subsequently processing the body 16, such bipolar transistor 82 being shown in FIG. 7. The HBT 82 includes base contact electrode 90, an emitter contact electrode 92 and a collector contact electrode 94.

Figure 7:
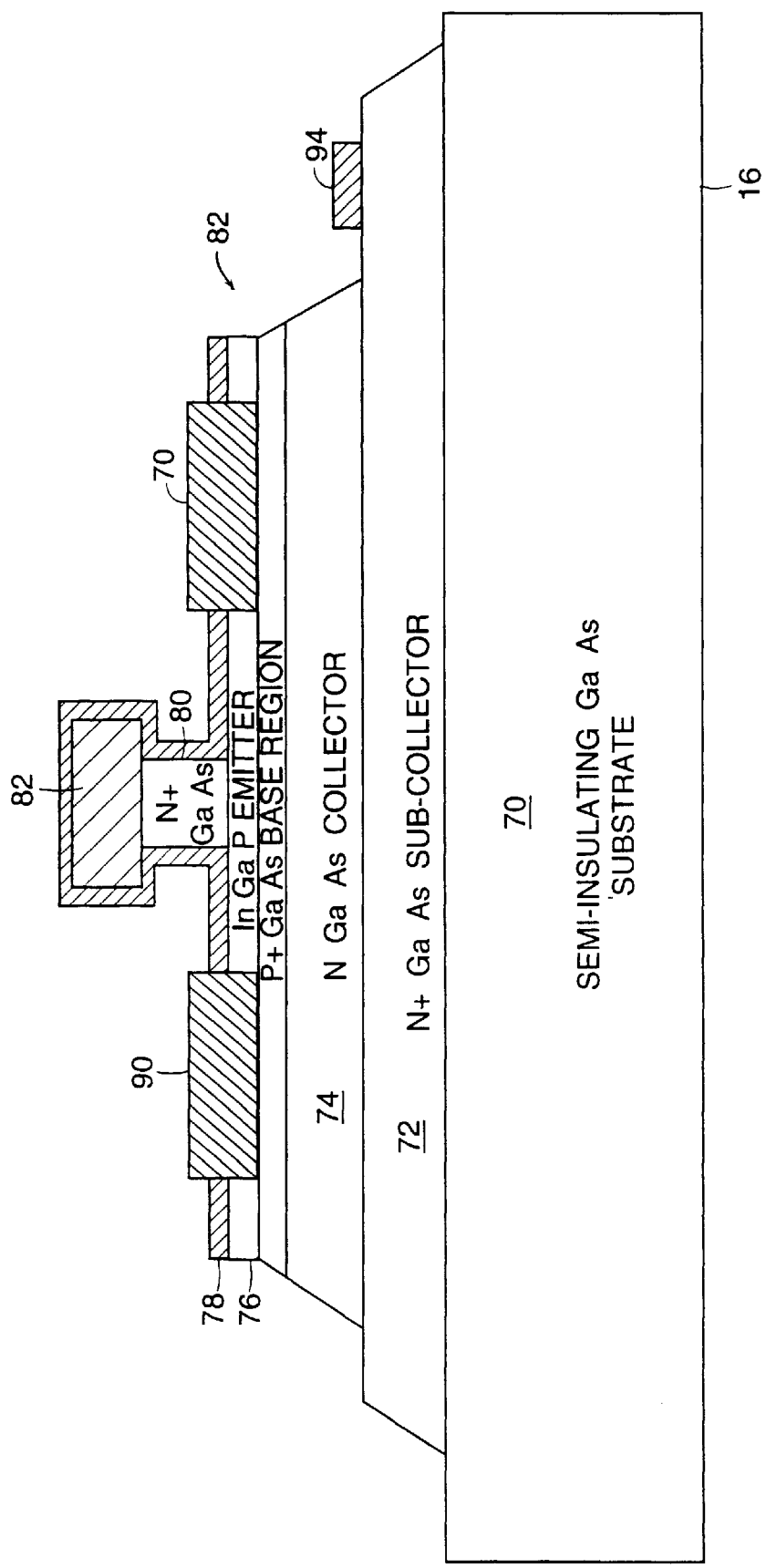
FIG. 7 is a diagrammatical cross sectional view of the semiconductor body of FIG. 6 after such body has been fabricated from an HBT used in the mixer circuitry of FIG. 1.
Figure 8:
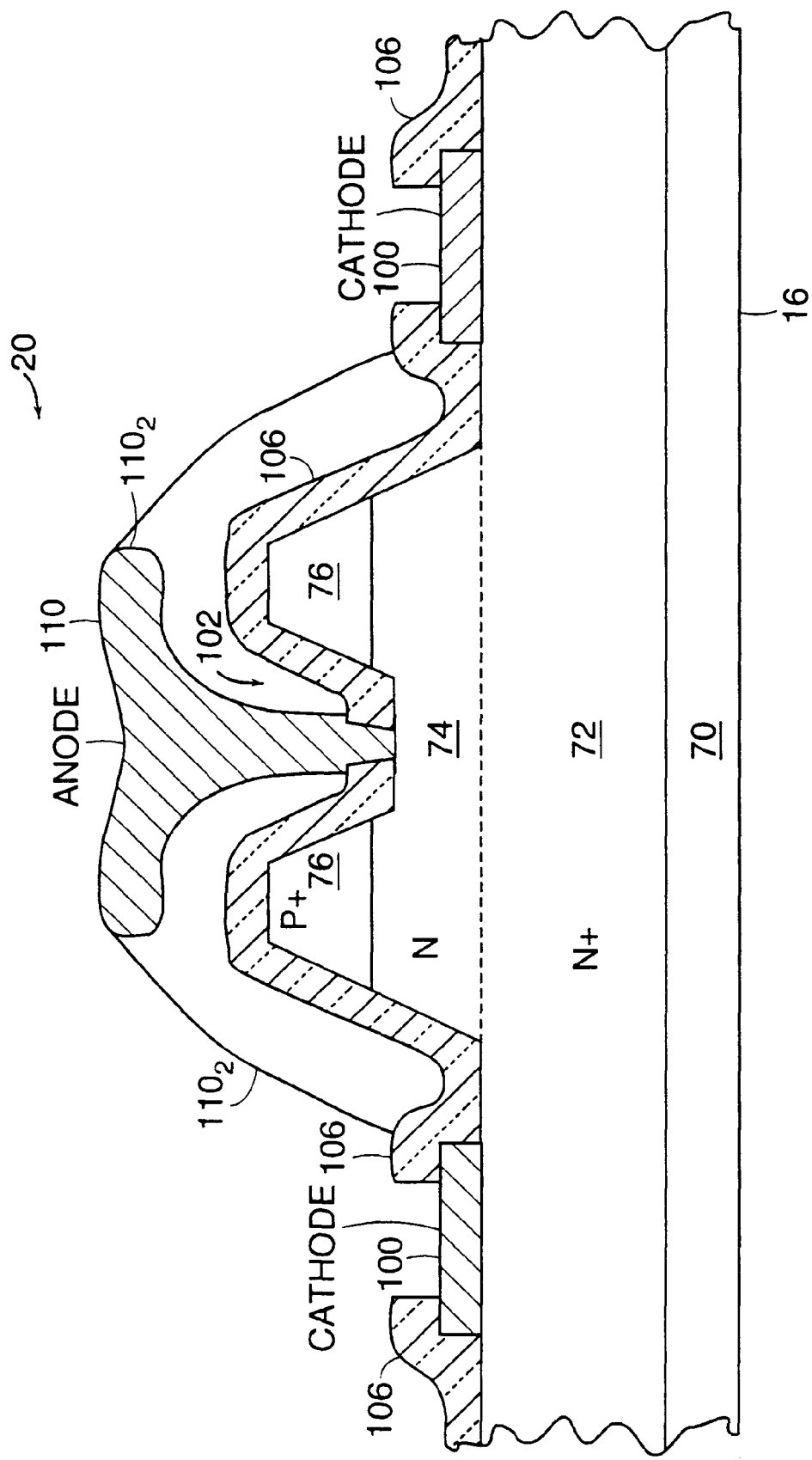
FIG. 8 is a diagrammatical cross sectional view of the semiconductor body of FIG. 6 after such body has been fabricated with a Schottky diode used in the mixer of FIG. 2.
Figure 9:
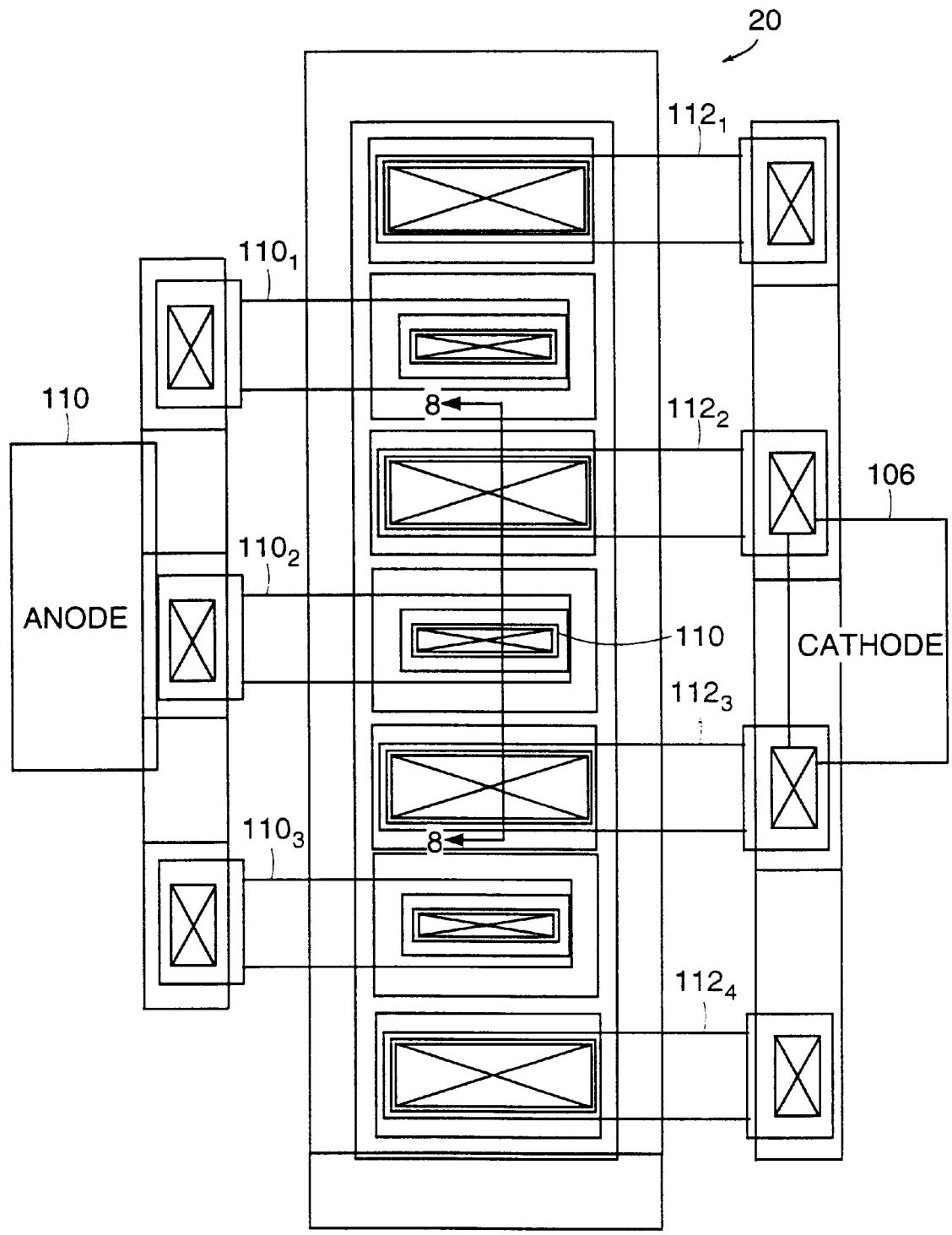
FIG. 9 is a plan view of the Schottky diode of FIG. 8, the cross section of FIG. 8 being taken along line 8—8 in FIG. 9.

The Schottky diodes 20, 22 are formed as mesas in another portion of the body 16, an exemplary one of such diodes 20, 22, here diode 20 being shown in FIGS. 8 and 9. It is noted that the cathode contact electrode 100 is formed during the same process that the collector contact electrode 94 (FIG. 7 is formed. Further, the emitter layer 78 (FIG. 7) is removed from the region of the body 16 where the diode 20 is to be formed; i.e., the region shown in FIG. 8. An opening 102 is formed in a portion of the underlying base layer 76 and into the upper portion of the exposed collector layer 74, as shown in FIG. 8. After the collector contacts 94 and cathode contacts 100 are formed during the same processing step, an insulating layer, here a layer 106 of silicon nitride is deposited over the surface of the body 16. The silicon nitride layer 106 is patterned with the opening 102 to expose a portion of the collector layer 74. A suitable metal 90, here 1000 Å titanium, 1000 Å platinum and 8000 Å gold, is deposited directly onto the exposed surface of the collector layer 74 and processed to form a Schottky barrier contact with the collector layer 74. The metal 110 serves as the anode of the diode 20. The cathode contact 100 is made through the top of the body 16 by etching down and contacting the very highly doped subcollector region 72 at during the same processing step used to form the collector contact electrode 94. The doping level of the collector layer 72 is here in the range from $2 \times 10^{16}$ atoms per cm$^3$ to $5 \times 10^{16}$ atoms per cm$^2$ and the thickness of such layer 72 is here 0.5 micrometers. Such doping level and thickness for the collector layer 72 was found to be the best compromise between diode 20 and HBT 82 (FIG. 7) performance. The area of each of the diodes 20, 22 was 15 square microns (i.e., each diode 20, 22 included three anode fingers $110_1$–$110_3$ and 4 cathode fingers $112_1$–$112_4$, as shown in FIG. 9 for diode 20). It is noted that the anode fingers $110_1$–$110_3$ and cathode fingers $112_1$–$112_4$ are connected to anode and cathode contact pads 110, 106 as conventional air-bridges.

Other embodiments are within the spirit and scope of the appended claims. For example, the HBT may be used in an amplifier circuit which is formed in a common III-V body with the Schottky diode of a mixer. In applications where an amplifier is also to be formed with a mixer, the amplifier may include the HBT so that the amplifier HBT and the mixer Schottky diode are formed in different regions of the same II-V body.

What is claimed is:

1. Mixer circuitry comprising:
   a semiconductor body, such body having formed therein circuitry comprising:
   an oscillator having a heterojunction bipolar transistor and adapted to provide an output signal; and,
   a mixer having a Schottky diode coupled to receive the output signal, the heterojunction transistor having a collector region formed in one portion of a doped layer of the semiconductor body and the diode having a metal electrode in Schottky contact with another portion of such doped layer; and
   a bias circuit adapted to DC bias the Schottky diode to a predetermined operating condition substantially invariant with power of the output signal.

2. The mixer circuitry recited in claim 1 wherein the body includes:

a semi-insulating III–IV substrate;

a subcollector layer disposed on the substrate;

wherein the doped layer is an N type conductivity gallium arsenide collector layer disposed on the subcollector layer;

a base layer disposed on the collector layer; and wherein, in one region of the body the transistor has the emitter layer thereof disposed on the base layer; and wherein, in another region of the body the Schottky diode has a cathode in contact with the subcollector layer and an anode in Schottky contact with the collector layer.

3. The mixer circuitry recited in claim 2 wherein the collector layer has a doping level in the range of $2\times10^{16}$ atoms per $cm^2$ to $5\times10^{16}$ atoms per $cm^2$.

4. The mixer circuitry recited in claim 2 wherein the collector layer has a thickness of 0.5 micrometers.

5. The mixer circuitry recited in claim 4 wherein the substrate is gallium arsenide.

6. The mixer circuitry recited in claim 5 wherein the subcollector layer is N+ type conductivity gallium arsenide.

7. The mixer circuitry recited in claim 6 wherein the base layer is P+ type conductivity gallium arsenide.

8. The mixer circuitry recited in claim 7 wherein the emitter layer is indium gallium phosphide or aluminum gallium arsenide.

9. The mixer circuitry recited in claim 1 wherein the bias circuit provides a constant current to the Schottky diode.

10. The mixer circuitry recited in claim 9 wherein the predetermined operating condition is one of substantially minimum conversion loss of the Schottky diode.

11. Mixer circuitry comprising:

a semiconductor body having a Schottky diode formed therein; and a bias circuit adapted to DC bias the Schottky diode to a predetermined operating condition substantially invariant with power of a signal received by the Schottky diode.

12. The mixer circuitry recited in claim 1 wherein the bias circuit provides a constant current to the Schottky diode.

13. The mixer circuitry recited in claim 12 wherein the predetermined operating condition is one of substantially minimum conversion loss of the Schottky diode.

14. The mixer circuitry recited in claim 13 wherein the semiconductor body also has an oscillator, including a heterojunction bipolar transistor, formed therein that provides the signal received by the Schottky diode.

* * * * *